(12) United States Patent
Tamura et al.

(10) Patent No.: US 6,649,494 B2
(45) Date of Patent: Nov. 18, 2003

(54) MANUFACTURING METHOD OF COMPOUND SEMICONDUCTOR WAFER

(75) Inventors: Satoshi Tamura, Takarazuki (JP); Masahiro Ogawa, Higashiosaka (JP); Masahiro Ishida, Hirakata (JP); Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/054,844

(22) Filed: Jan. 25, 2002

(65) Prior Publication Data

US 2002/0102819 A1 Aug. 1, 2002

(30) Foreign Application Priority Data

Jan. 29, 2001 (JP) .......................................... 2001-019547
Jan. 29, 2001 (JP) .......................................... 2001-019551

(51) Int. Cl.⁷ ............................................. H01L 21/00
(52) U.S. Cl. ........................ 438/481; 438/489; 438/507; 438/503; 438/795; 117/90; 117/103; 117/104; 117/915; 117/952

(58) Field of Search ................................. 438/464, 479, 438/481, 483, 977, FOR 484, FOR 485, 489, 507, 503, FOR 476, FOR 477, FOR 293, FOR 246, FOR 249, 795; 257/615, 21.121; 117/84, 104, 904, 952, 103, 995

(56) References Cited

U.S. PATENT DOCUMENTS 5,032,544 A * 7/1991 Ito et al. .................... 438/459
6,071,795 A 6/2000 Cheung et al.
2001/0049201 A1 * 12/2001 Park ........................... 438/758

* cited by examiner

Primary Examiner—George Fourson
Assistant Examiner—Julio J. Maldonado
(74) Attorney, Agent, or Firm—Nixon Peabody LLP; Donald R. Studebaker

(57) ABSTRACT

A protector film is formed on the surface of a substrate to cover at least the side surface thereof. Then, a compound semiconductor film including nitrogen is grown through epitaxial growth on the substrate at an exposed portion. Then, the substrate and the compound semiconductor film are separated from each other by irradiation of laser light, polishing of the substrate, etching, cutting, etc. Consequently, the resulting compound semiconductor film is used as a free-standing wafer.

21 Claims, 13 Drawing Sheets

LASER LIGHT

LASER LIGHT

LASER LIGHT

MANUFACTURING METHOD OF COMPOUND SEMICONDUCTOR WAFER

BACKGROUND OF THE INVENTION

The present invention relates to a manufacturing method of a compound semiconductor wafer made of a compound semiconductor including nitrogen in its composition and used in a short wavelength laser, a high-temperature operating transistor, etc.

Conventionally, it has been known that a compound semiconductor including at least one element selected from Ga, Al, B, As, In, P and Sb and N (hereinafter, referred to as nitride semiconductor) has broad bandgap energy from the ultraviolet region to the visible region, and therefore, is a potential semiconductor material for light emitting and light receiving devices. A typical example of the nitride semiconductor is a compound semiconductor expressed by a general formula $B_xAl_yGa_zIn_{1-x-y-z}N$, where $0 \leq x \leq 1$, $0 \leq y \leq 1$, $0 \leq z \leq 1$, and $0 \leq x+y+z \leq 1$. Recently, there has been an increasing demand for a good-quality and large-area nitride semiconductor wafer, and most of all, a free-standing wafer (self-standing wafer), realized as an underlying substrate used when manufacturing a device from the nitride semiconductor.

The free-standing nitride semiconductor wafer is a wafer made of a nitride semiconductor alone excluding any material other than the nitride semiconductor. Generally, in order to obtain the free-standing nitride semiconductor wafer, a method of conducting epitaxial growth of a nitride semiconductor film on a substrate made of a material other than the nitride semiconductor and removing the substrate later is used. As is disclosed in, for example, U.S. Pat. No. 6,071,795, a technique of irradiating a beam of laser light from an excimer KrF laser or a Nd/YAG laser to the substrate from the back surface thereof (laser lift-off) has been known as one of the methods of removing the substrate.

FIGS. 13A and 13B are cross sections showing the steps of forming a conventional free-standing nitride semiconductor film.

Initially, a sapphire substrate 101 (for example, a sapphire wafer measuring two inches across), which is transparent with respect to laser light from the excimer KrF laser or Nd/YAG laser, is prepared. Then, the sapphire substrate 101 is placed in a hydride vapor phase epitaxy (hereinafter, abbreviated to HVPE) apparatus.

Subsequently, in the step shown in FIG. 13A, a nitride semiconductor film 102, for example, made of GaN and having a thickness of approximately 300 $\mu$m, is formed on the sapphire substrate 101 through HVPE. At this point, the nitride semiconductor film 102 has a plane portion 102a located on the top surface of the sapphire substrate 101 and a side surface portion 102b located on the side surface of the sapphire substrate 101.

Then, strong laser light having, for example, a wavelength of 355 nm, is irradiated to the sapphire substrate 101 from the back surface thereof. Because the sapphire substrate 101 transmits light and the irradiated laser light has an extremely short pulse width, the laser light is absorbed in the plane portion 102a of the nitride semiconductor film 102 only at a region in contact with the sapphire substrate 101, that is, the back surface portion. As a result, the back surface portion of the plane portion 102a of the nitride semiconductor film 102 is heated, and undergoes heat dissociation to be decomposed to gallium and nitrogen, whereupon a nitrogen gas is released. Thus, the nitride semiconductor film 102 separates from the sapphire substrate 101 as laser light scans the surface of the sapphire substrate 101 entirely. Then, by removing the sapphire substrate 101, the nitride semiconductor film 102 that will be made into a free-standing nitride semiconductor wafer can be obtained. Thereafter, one or two or more crystalline layers of a compound semiconductor including at least one element selected from Ga, Al, B, As, In, P and Sb and N in its composition (a compound semiconductor expressed by a general formula $B_xAl_yGa_zIn_{1-x-y-z}N$, where $0 \leq x \leq 1$, $0 \leq y \leq 1$, $0 \leq z \leq 1$, and $0 \leq x+y+z \leq 1$) are grown through epitaxial growth on the nitride semiconductor film 102, whereby various kinds of compound semiconductor devices can be obtained.

As another method of obtaining the free-standing nitride semiconductor wafer, there also has been known a method of obtaining a nitride semiconductor film that will be made into the free-standing nitride semiconductor wafer by mechanically polishing the sapphire substrate 101.

As a still another method of obtaining the freestanding nitride semiconductor wafer, there has been attempted a method of using a GaAs substrate, an Si substrate, etc., which are materials that can be readily removed by means of etching, instead of the sapphire substrate, so that the GaAs substrate or Si substrate is removed not by means of polishing but by means of wet etching after the epitaxial growth of the nitride semiconductor film through HVPE.

However, the above conventional methods have inconveniences as follows.

That is, according to the method shown in FIGS. 13A and 13B, of the entire nitride semiconductor film 102, the back surface portion of the plane portion 102a is decomposed by irradiation of laser light, so that it is relatively easy to separate the plane portion 102a of the nitride semiconductor film 102 from the sapphire substrate 101. However, because laser light is hardly irradiated to the side surface portion 102b of the nitride semiconductor film 102, it is generally difficult to decompose a region in the vicinity of the interface of the side surface portion 102b and the sapphire substrate 101. Hence, for example, if the sapphire substrate 101 and the nitride semiconductor film 102 are heated in trying to separate the nitride semiconductor film 102 and the sapphire substrate 101 from each other, a difference in coefficients of thermal expansion between the side surface portion 102b of the nitride semiconductor film 102 and the sapphire substrate 101 produces stress, which is applied intensively to the side surface portion 102b of the nitride semiconductor film 102. Accordingly, a crack occurs on the side surface portion 102b, which may possibly result in a braking of the plane portion 102a of the nitride semiconductor film 102.

And, the crystal orientation differs in the sapphire substrate 101 between the side surface portion and the top surface portion. Moreover, crystallinity is disturbed by machining treatment or the like during the manufacturing of the substrate, and the crystallinity at the side surface portion 102b of the nitride semiconductor 102 is so poor that there is a portion having an almost polycrystalline structure. For this reason, the side surface portion 102b of the nitride semiconductor film 102, in general, readily causes a breaking or a chipping, which becomes one of the factors of the occurrence of inconveniences.

Also, according to the method of removing the sapphire substrate 101 by means of polishing, the side surface portion 102b of the nitride semiconductor 102 is also polished while the sapphire substrate 101 is polished. Hence, mechanical stress readily causes a crack or a breaking that would run up to the plane portion 102a of the nitride semiconductor film 102 from a point where such a crack or breaking caused first on the side surface portion 102b. Thus, if this method is used, it is difficult to obtain an independent large-area nitride semiconductor film 102 with satisfactory reproducibility.

Also, according to the method of using the GaAs substrate or Si substrate and removing the GaAs substrate or Si substrate not by means of polishing but by means of etching, the nitride semiconductor film 102 readily breaks when handled in the form of a wafer after the substrate is removed, and a significant crack or breaking readily occurs in the nitride semiconductor film 102 from a point where it breaks first. Hence, if this method is used, it is also difficult to obtain an independent large-area nitride semiconductor film 102 with satisfactory reproducibility.

Further, an independent nitride semiconductor wafer (nitride semiconductor film 102) obtained in the above manner is generally subjected to surface polishing treatment before a semiconductor device or the like is formed thereon. However, the side surface portion 102b readily breaks also by mechanical stress during the surface polishing step, and the entire wafer may possibly break from a point where the breaking caused first.

Even in a case where the entire wafer does not break, a crack may remain within the wafer by excessive mechanical stress applied during the separating or polishing step. In case that a semiconductor element, such as a field effect transistor, an LED, and a laser diode, is formed on the nitride semiconductor wafer having a remaining crack therein, the remaining crack may cause leakage of a current and reduces the reliability, or the crack may scatter light around it and reduces a light emitting efficiency.

SUMMARY OF THE INVENTION

It is therefore an object of the present invention to provide a manufacturing method of a compound semiconductor wafer, by which a free-standing large-area nitride semiconductor wafer can be obtained at a high yield and with satisfactory reproducibility.

A first manufacturing method of a compound semiconductor wafer of the present invention includes: a step (a) of forming a closed-ring protector film covering a part of a top surface and a side surface of a substrate; a step (b) of conducting, after the step (a), epitaxial growth of a compound semiconductor film including nitrogen in a composition thereof on the top surface and the side surface of the substrate at a region where it is not covered with the protector film; and a step (c) of removing the substrate after the step (b), wherein the protector film formed in the step (a) has a function of interfering with the epitaxial growth of the compound semiconductor film formed in the step (b).

According to this method, it is possible to use, of the entire compound semiconductor film, only a portion grown through epitaxial growth from the top surface of the substrate as a free-standing wafer. Also, because this portion has no portion grown from the side surface of the substrate, it is possible to control the occurrence of a crack or a chipping in the latter steps. Further, it is possible to obtain a good-quality wafer that is hardly influenced by changes of the epitaxial growth conditions in the vicinity of the side surface of the substrate.

In the step (a), by forming the protector film so as to at least cover the side surface of the substrate entirely, it is possible to form the compound semiconductor film from only a portion grown through epitaxial growth from the top surface of the substrate, and as a result, the foregoing advantages can be exerted in a reliable manner.

In the step (a), by forming the protector film so as to cover only a part of the top surface of the substrate, a compound semiconductor film grown through epitaxial growth from the top surface of the substrate and a compound semiconductor film grown through epitaxial growth from the side surface of the substrate are obtained, and only the former can be used as a free-standing wafer.

In the step (a), by forming the protector film so that a minimum value of a ring width of the protector film is larger than a film thickness of the compound semiconductor film, it is possible to separate a compound semiconductor film grown through epitaxial growth from the top surface of the substrate from a compound semiconductor film grown through epitaxial growth from the side surface of the substrate in a reliable manner.

It is preferable that the protector film is made of at least one film selected from a silicon dioxide film, a silicon nitride film, a silicon oxynitride film, and a refractory metal film.

In the step (c), the substrate may be removed by means of polishing.

In the step (b), the compound semiconductor film is formed from a compound semiconductor having an absorption edge wavelength longer than an absorption edge wavelength of the substrate, and in the step (c), by irradiating light having an intermediate wavelength between the absorption edge wavelength of the substrate and the absorption edge wavelength of the compound semiconductor film from the substrate side, it is possible to decompose a part of the compound semiconductor film and thereby to separate the substrate from the compound semiconductor film.

In the step (c), the substrate may be removed by means of etching.

Also, it is preferable to polish a back surface of the compound semiconductor film after the step (c).

A second manufacturing method of a compound semiconductor wafer of the present invention includes: a step (a) of conducting epitaxial growth of a compound semiconductor film including nitrogen in a composition thereof on a substrate; a step (b) of removing at least a portion of the compound semiconductor film located on a side surface of the substrate; and a step (c) of removing the substrate after the step (b).

According to this method, it is possible to use, of the entire compound semiconductor film, only a portion grown through epitaxial growth from the top surface of the substrate as a free-standing wafer. Also, because this portion has no portion grown from the side surface of the substrate, it is possible to control the occurrence of a crack or a chipping in the latter steps. In particular, a portion influenced by changes of the epitaxial growth conditions in the vicinity of the side surface of the substrate can be removed in a more reliable manner, a good-quality wafer can be obtained.

In the step (b), at least the portion of the compound semiconductor film located on the side surface of the substrate may be removed by means of polishing.

In the step (b), a portion of the substrate and the compound semiconductor film located a certain distance inside the side surface is cut in a closed-ring shape.

In the step (b), an inside portion of the compound semiconductor film up to a certain distance from the side surface may be removed.

In the step (b), it is preferable to form a compound semiconductor film including at least one element selected from Ga, Al, B, As, In, P and Sb, and N in its composition as the compound semiconductor film.

The manufacturing method of the second compound semiconductor wafer can also adopt the above-discussed preferred embodiments adopted by the manufacturing method of the first compound semiconductor wafer.

A third manufacturing method of a compound semiconductor wafer of the present invention includes: a step (a) of depositing a film covering a top surface and a side surface of a substrate; a step (b) of removing the film until at least the top surface of the substrate is exposed, thereby flattening the substrate and the film at the top to form a closed-ring protector film covering at least the side surface of the substrate; a step (c) of conducting, after the step (b), epitaxial growth of a compound semiconductor film including nitrogen in a composition thereof on the top surface of the substrate at a region where it is not covered by the protector film; and a step (d) of removing the substrate after the step (c). The protector film formed in the step (b) has a function of interfering with the epitaxial growth of the compound conductor film formed in the step (c).

According to this method, only a portion of the compound semiconductor film that is epitaxially grown from the top surface of the substrate can be used as a freestanding wafer. Since this portion has no part grown from the side surface of the substrate, it is possible to control the occurrence of a crack or a chipping in the latter steps. In addition, it is possible to obtain a wafer of good quality that is less susceptible to variations in the epitaxial growth condition around the side surface of the substrate.

The step (a) may be preceded by an additional step of removing a peripheral portion of the substrate to a certain depth to form a notch. In the step (b), the protector film is then formed so as to cover the side surface and the notch of the substrate. In such a case, it is possible to obtain a wafer of good quality that is still less susceptible to variations in the epitaxial growth conditions around the side surface of the substrate, aside from the foregoing effect.

DETAILED DESCRIPTION OF THE INVENTION

The following description will describe, with reference to accompanying drawings, manufacturing methods of nitride compound semiconductor wafers and semiconductor devices according to embodiments of the present invention.

(First Embodiment)

FIGS. 1A through 1E are longitudinal sections and plan views showing a manufacturing method of a compound semiconductor wafer according to a first embodiment of the present invention. In FIGS. 1A through 1E, a sapphire substrate and a GaN film are illustrated as circles, but it is general that an orientation flat that indicates the wafer's crystal orientation is provided at a part thereof. Even in such a case, the same advantages can be achieved by the present embodiment and each modified example thereof and by each embodiment described below. Hence, in the following description, it is assumed that the term "circle" includes a case where the orientation flat is provided.

Figure 1A:
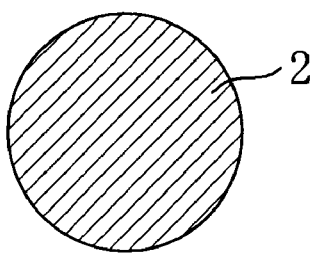
FIGS. 1A through 1E are longitudinal sections and plan views showing a manufacturing method of a compound semiconductor wafer according to a first embodiment of the present invention.
Figure 1A:
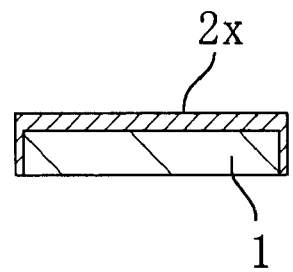

Initially, in the step shown in FIG. 1A, an $SiO_2$ film $2x$ having a thickness of approximately 100 nm is formed by means of CVD on the surface of a sapphire substrate 1 (sapphire wafer) having a diameter of approximately 50.8 mm and a thickness of approximately 300 $\mu$m. At this point, the $SiO_2$ film $2x$ covers the top surface and side surface of the sapphire substrate 1.

Figure 1B:
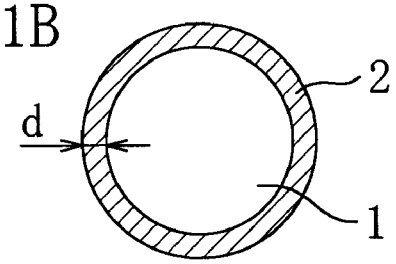
Figure 1B:
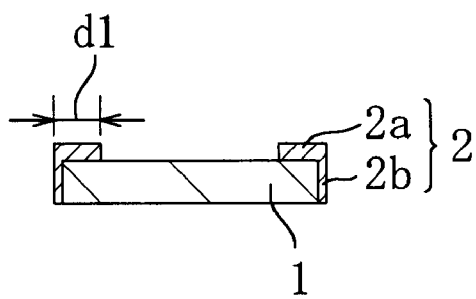

Then, in the step shown in FIG. 1B, the $SiO_2$ film $2x$ is patterned by means of photolithography and wet etching, whereby formed from the $SiO_2$ film $2x$ is a protector film 2 composed of a closed ring portion $2a$ with a ring width d1 (for example, 2 mm) covering the top surface of the sapphire substrate 1 and a side surface portion $2b$ covering the side surface of the sapphire substrate 1.

Figure 1C:
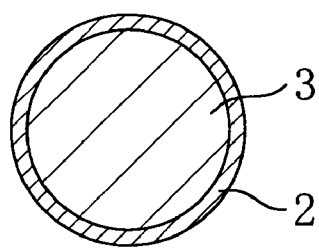
Figure 1C:
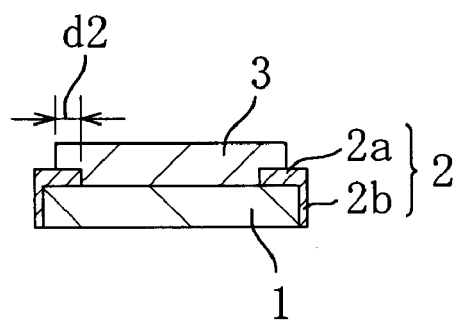

Then, in the step shown in FIG. 1C, the sapphire substrate 1 provided with the protector film 2 is set in a reactor furnace of an HVPE apparatus, and from the upstream end of the reactor furnace, a GaCl gas produced by Ga metal and a HCl gas and an ammonia gas ($NH_3$) are supplied as raw material gases and a nitrogen gas ($N_2$) is supplied as a carrier gas while the sapphire substrate 1 is kept heated at approximately 1000° C. Consequently, in approximately seven and a half hours, a GaN film 3 having a thickness of approximately 300 μm is grown through epitaxial growth on the top surface of the sapphire substrate 1 at an exposed portion. At this point, GaN crystals are not grown through epitaxial growth on the protector film 2, which is an SiO$_2$ film, and for this reason, the diameter of the bottom portion of the GaN film 3 is substantially equal to the inner diameter (approximately 46 mm in the present embodiment) of the closed ring portion 2a of the protector film 2. However, once the GaN crystals are grown upward through epitaxial growth to reach the top surface of the protector film 2, the GaN crystals are then grown through lateral growth toward the side surface along the top surface of the protector film 2. Hence, the diameter of the top portion of the GaN film 3 is slightly larger than 46 mm in the end. For example, in the present embodiment, the diameter of the top portion of the GaN film 3 is approximately 46.6 mm and a dimension shown in FIG. 1C is given as d2=0.3 mm.

Figure 1D:
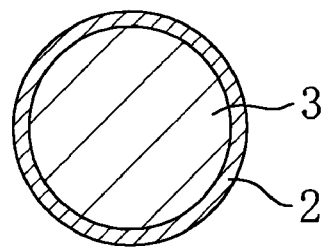
Figure 1D:
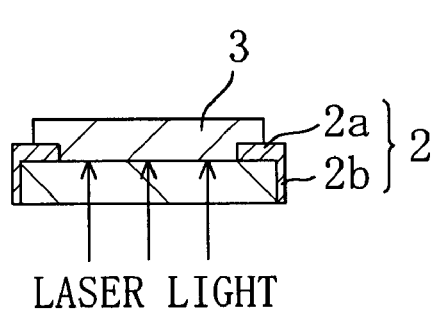

Next, in the step shown in FIG. 1D, the wafer is taken out from the reactor furnace of the HVPE apparatus and a beam of laser light, herein the third harmonics having a wavelength of 355 nm from a Nd/YAG laser, is irradiated to the GaN film 3 from the back surface of the sapphire substrate 1. The absorption edge wavelength of GaN is approximately 360 to 370 nm, which is longer than the wavelength of the laser light, and therefore, GaN absorbs the laser light and generates heat. By increasing the energy density of the laser light satisfactorily, the GaN film 3 at a portion in contact with the sapphire substrate 1, that is, the back surface portion thereof, is decomposed due to the heat generation in the vicinity of the interface. In the present embodiment, such a phenomenon can be confirmed when the energy density of the laser light is nearly 0.4 J/cm$^2$ or higher.

Figure 1E:
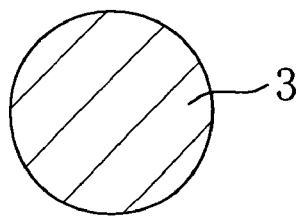
Figure 1E:
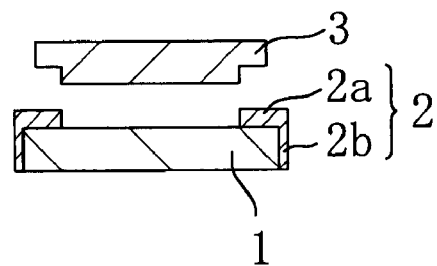

By scanning a beam of laser light on the surface of the wafer entirely under the above conditions, the free-standing GaN film 3 (GaN wafer) separated from the sapphire substrate 1 as shown in FIG. 1E is obtained.

In the present embodiment, the closed-ring protector film 2 covering a part of the top surface and the side surface of the sapphire substrate 1 is formed first, and thence the GaN film 3, which is the nitride semiconductor film, is grown through epitaxial growth on the sapphire substrate 1 at a region where it is not covered with the protector film 2 while leaving the protector film 2 intact. Hence, because the GaN crystals are not grown on the side surface of the sapphire substrate 1, it is possible to decompose, of the GaN film 3, the entire back surface portion in contact with the sapphire substrate 1 in a reliable manner. Accordingly, the GaN film 3 and the sapphire substrate 1 can be separated from each other smoothly, thereby making it possible to obtain a free-standing GaN wafer (nitride semiconductor wafer) with satisfactory reducibility.

Also, in a case where an LED made of a compound semiconductor including at least one element from Ga, Al, B, As, In, P and Sb, and N in its composition (for example, a compound semiconductor expressed by a general formula B$_x$Al$_y$Ga$_z$In$_{1-x-y-z}$N, where $0 \leq x \leq 1$, $0 \leq y \leq 1$, $0 \leq z \leq 1$, and $0 \leq x+y+z \leq 1$) is formed on the free-standing GaN film 3 (GaN wafer) obtained in the above manner, there is little leakage of a current and a highly reliable element can be obtained. The reason why is assumed that because mechanical stress is not applied excessively to the GaN film 3 during the step of separating the same from the sapphire substrate 1, no crack remains within the GaN film 3 (GaN wafer).

The GaN film 3 (GaN wafer) obtained in the present embodiment has a step-wise difference of some extent on the back surface thereof between a portion (top portion) grown through lateral growth along the top surface of the protector film 2 and a portion (bottom portion) grown through epitaxial growth upward within the opening portion of the protector film 2. However, such a step-wise difference can be readily eliminated by polishing the back surface of the GaN film 3(GaN wafer) after the GaN film 3 is separated from the sapphire substrate 1. In addition, because there is no portion grown through epitaxial growth from the side surface of the sapphire substrate 1 at the peripheral portion of the GaN film 3, a breaking of the GaN film 3 (GaN wafer) caused by mechanical stress hardly occurs even in such a back surface polishing step, thereby making it possible to obtain a large-area GaN wafer with satisfactory reproducibility.

Meanwhile, it is preferable that the ring width d1 of the closed ring portion 2a of the closed-ring protector film 2 made of SiO$_2$ is a ring width such that the portion of the GaN film 3 grown through lateral growth along the top surface of the protector film 2 does not reach the outer circumference end of the wafer. If the portion of the GaN film 3 grown through lateral growth reaches onto the side surface of the wafer, it may become a trouble when separating the GaN film 3 from the sapphire substrate 1 or polishing the back surface of the GaN film 3.

It should be appreciated, however, that the ring width d1 of the plane portion 2a of the closed-ring protector film 2 shown in FIG. 1B may be almost 0. In such a case, a portion of the nitride semiconductor film may be grown through lateral growth along the side surface of the wafer, but nevertheless, the GaN film 3 can be separated from the sapphire substrate 1 and the back surface of the GaN film 3 can be polished.

MODIFIED EXAMPLE 1

In the first embodiment above, the protector film 2 made of SiO$_2$ is left concentrically with respect to the sapphire substrate 1, but the protector film 2 is not necessarily a concentric circle.

Figure 2:
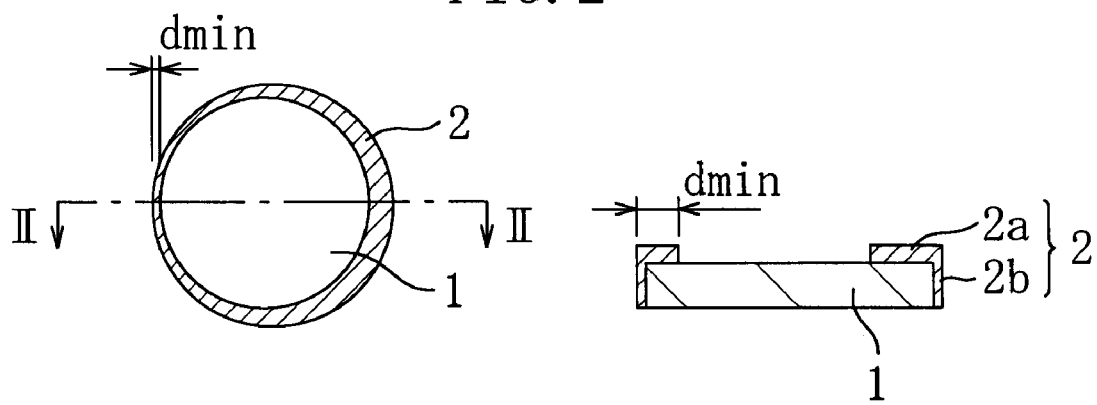
FIG. 2 shows a plan view of a sapphire substrate and a protector film according to a modified example 1 of the first embodiment and a longitudinal section taken along the line II—II.

FIG. 2 shows a plan view of the sapphire substrate 1 and the protector film 2 according to a modified example 1 of the first embodiment and a longitudinal section taken along the line II—II. FIG. 2 shows only a step corresponding to the step shown in FIG. 1B in the fabrication sequence of the modified example 1. As shown in FIG. 2, according to the modified example 1, the closed ring portion 2a of the protector film 2 is offset from the concentric position with respect to the center of the sapphire substrate 1. In this case, it is also preferable that the minimum value dmin of the ring width of the closed ring portion 2a is a ring width such that a portion of the GaN film 3 grown through lateral growth along the top surface of the protector film 2 does not reach the outer circumference end of the wafer. The reason why discussed in the first embodiment also applies herein.

MODIFIED EXAMPLE 2

The first embodiment above described a case where the substantially circular GaN film 3 is formed on the substantially circular sapphire substrate 1. However, the shapes of the sapphire substrate 1 and the GaN film 3 can be selected arbitrarily.

Figure 3:
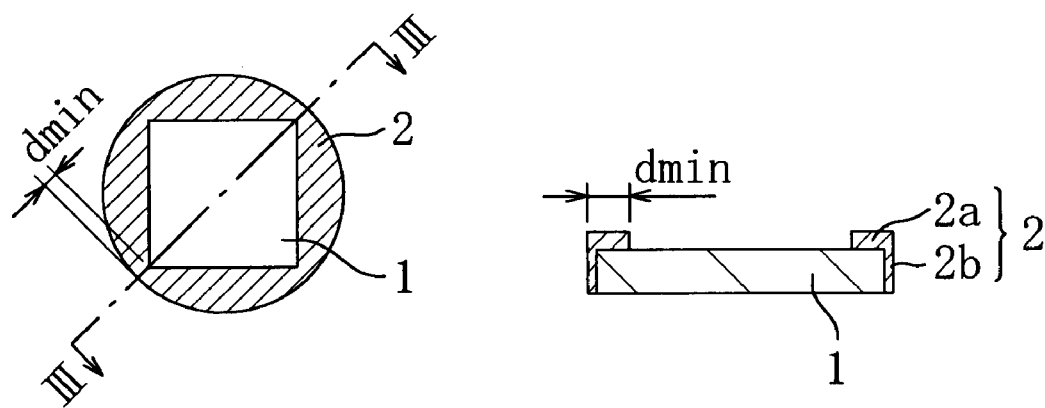
FIG. 3 shows a plan view of a sapphire substrate and a protector film according to a modified example 2 of the first embodiment and a longitudinal section taken along the line III—III.

FIG. 3 shows a plan view of the sapphire substrate 1 and the protector film 2 according to a modified example 2 of the first embodiment and a longitudinal section taken along the line III—III. FIG. 3 shows only a step corresponding to the step shown in FIG. 1B in the fabrication sequence of the modified example 2. As shown in FIG. 3, according to the modified example 2, the sapphire substrate 1 is substantially a circle whereas the inner circumference portion of the closed ring portion 2a of the protector film 2 is a rectangle. Hence, a rectangular GaN film is grown through epitaxial growth on the substantially circular sapphire substrate 1. In this case, it is also preferable that the minimum value dmin of the ring width of the closed ring portion 2a is a ring width such that a portion of the GaN film 3 grown through lateral growth along the top surface of the protector film 2 does not reach the outer circumference end of the wafer. The reason why discussed in the first embodiment also applies herein. (Modified example 3)

Figure 4:
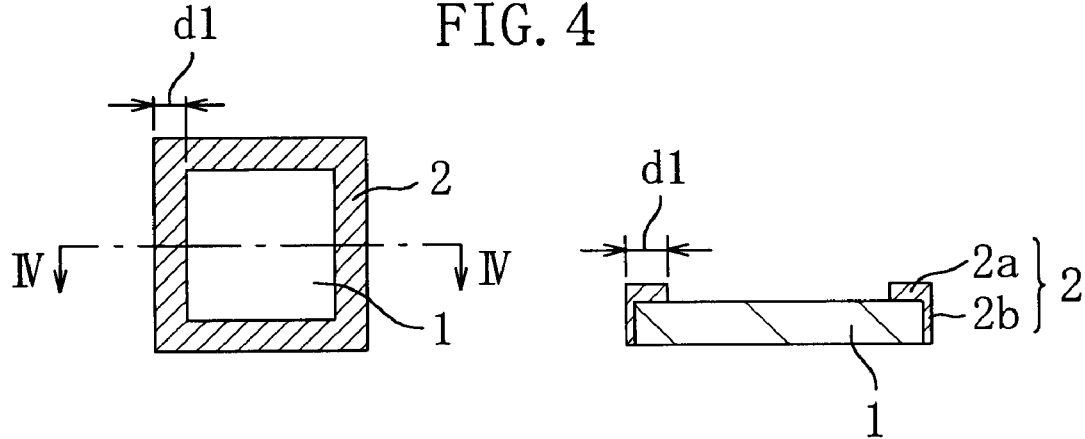
FIG. 4 shows a plan view of a sapphire substrate and a protector film according to a modified example 3 of the first embodiment and a longitudinal section taken along the line IV—IV.

FIG. 4 shows a plan view of the sapphire substrate 1 and the protector film 2 according to a modified example 3 of the first embodiment and a longitudinal section taken along the line IV—IV. FIG. 4 shows only a step corresponding to the step shown in FIG. 1B in the fabrication sequence of the modified example 3. As shown in FIG. 4, according to the modified example 3, the sapphire substrate 1 is a rectangle and so is the inner circumference portion of the closed ring portion 2a of the protector film 2. Hence, a rectangular GaN film is grown through epitaxial growth on a rectangular sapphire substrate 1. In this case, it is also preferable that the ring width d1 of the closed ring portion 2a is a ring width such that a portion of the GaN film 3 grown through lateral growth along the top surface of the protector film 2 does not reach the outer circumference end of the wafer. The reason why discussed in the first embodiment also applies herein.

MODIFIED EXAMPLE 4

FIGS. 15A through 15D are cross sections showing a manufacturing method of a compound semiconductor wafer according to a modified example 4 of the first embodiment of the present invention.

Figure 15A:
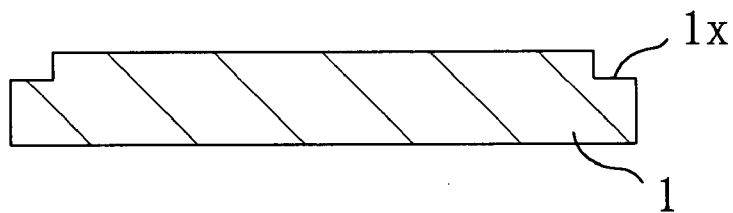
FIGS. 15A through 15D are cross sections showing a manufacturing method of a compound semiconductor wafer according to a modified example 4 of the first embodiment of the present invention.

Initially, in the step shown in FIG. 15A, a sapphire substrate 1 (sapphire wafer) having a diameter of approximately 50.8 mm and a thickness of approximately 300 μm is polished away at its corner portion, for example, by using a diamond wheel. This forms a notch 1x having a width of 2 mm and a depth of 1 μm, for example.

Figure 15B:
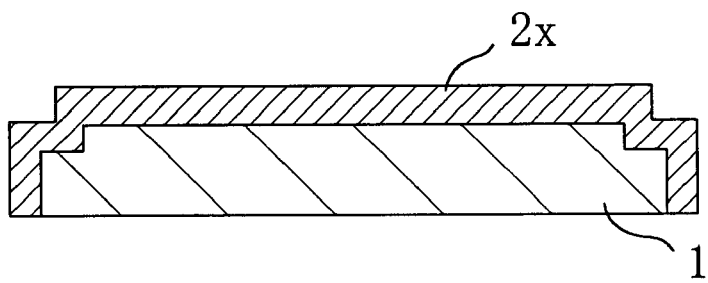

Next, in the step shown in FIG. 15B, an SiO$_2$ film 2x having a thickness of approximately 1.1 μm is formed by CVD over the surface of the sapphire substrate 1. Here, the SiO$_2$ film 2x covers the top surface and side surface of the sapphire substrate 1 (including the notch 1x).

Figure 15C:
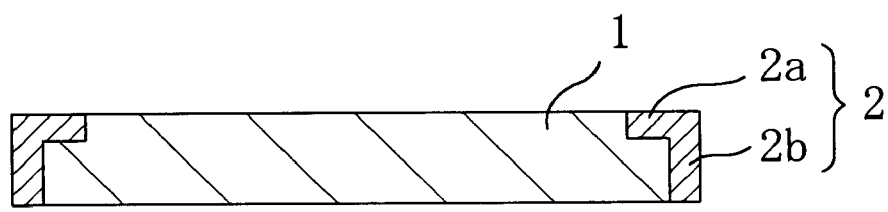

Then, in the step shown in FIG. 15C, chemical mechanical polishing (CMP) is performed until the top surface of the sapphire substrate 1 is exposed, whereby the SiO$_2$ film 2x and the sapphire substrate 1 are flattened at the top. Consequently, the SiO$_2$ film 2x is formed into a protector film 2 which consists of a closed ring portion 2a having a ring width of 2 mm, covering the notch 1x of the sapphire substrate 1, and a side surface portion 2b covering the side surface of the sapphire substrate 1.

Figure 15D:
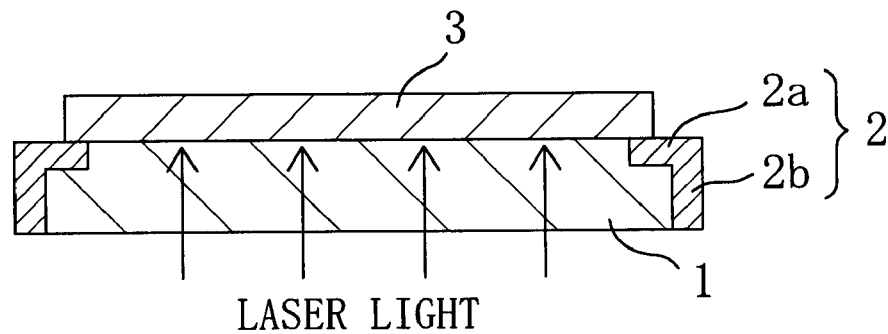

Next, in the step shown in FIG. 15D, a GaN film 3 having a thickness of approximately 300 μm is grown through epitaxial growth on the exposed part of the top surface of the sapphire substrate 1 under the same procedure and condition as in the first embodiment. At this point, the GaN crystal is also laterally grown sideways along the top surface of the protector film 2. This gives the GaN film 3 a diameter larger than the inner diameter of the closed ring portion 2a of the protector film 2 (approximately 46 mm in the present embodiment).

Next, the wafer is taken out of the reactor furnace of the HVPE apparatus. Under the same procedure and condition as in the first embodiment, the GaN film 3 is irradiated with a beam of laser light from the back surface of the sapphire substrate 1. The beam of laser light is scanned over the entire surface of the wafer, so that the free-standing GaN film 3 (GaN wafer) separated from the sapphire substrate 1 is obtained as in the first embodiment.

In this modified example, the notch 1x is previously formed in the peripheral portion of the sapphire substrate 1. Then, the closed-ring protector film 2 which covers the notch 1x and the side surface of the sapphire substrate 1 is formed through SiO$_2$ film deposition and CMP. This protector film 2 is left intact while the GaN film 3, a nitride semiconductor film, is grown through epitaxial growth on the sapphire substrate 1 where not covered by the protector film 2. Since no GaN crystal grows on the side surface of the sapphire substrate 1, the GaN film 3 can be surely decomposed at its entire back surface portion which is in contact with the sapphire substrate 1 and the protector film 2. Accordingly, as in the first embodiment, the GaN film 3 and the sapphire substrate 1 can be separated from each other smoothly, and a free-standing GaN wafer (nitride semiconductor wafer) can be obtained with excellent reproducibility.

This modified example has the advantage that the free-standing GaN wafer having a nearly flat back surface can be obtained without polishing the back surface of the GaN film 3 in particular.

There is another advantage that after the separation of the GaN film 3 and the sapphire substrate 1, the sapphire substrate 1 having the protector film 2 thereon can be recycled through brief CMP alone.

MODIFIED EXAMPLE 5

Figure 16A:
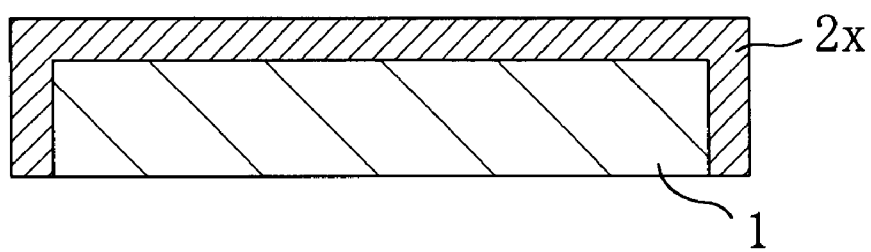
FIGS. 16A through 16C are cross sections showing a manufacturing method of a compound semiconductor wafer according to a modified example 5 of the first embodiment of the present invention.
Figure 16B:
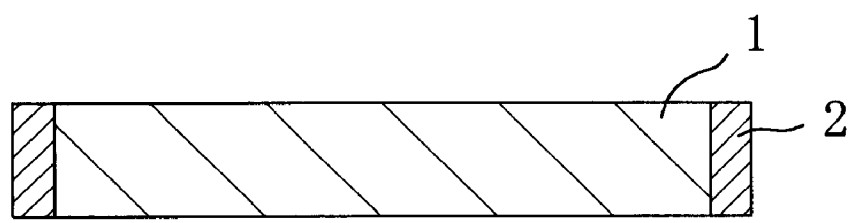
Figure 16C:
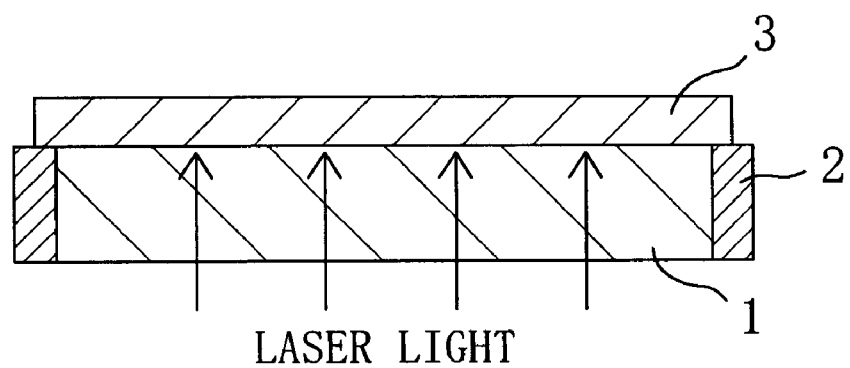

FIGS. 16A through 16C are cross sections showing a manufacturing method of a compound semiconductor wafer according to a modified example 5 of the first embodiment of the present invention.

Initially, in the step shown in FIG. 16A, an SiO$_2$ film 2x having a thickness of approximately 1 μm is formed by CVD over the surface of a sapphire substrate 1 (sapphire wafer) having a diameter of approximately 50.8 mm and a thickness of approximately 300 μm. Here, the SiO$_2$ film 2x covers the top surface and the side surface of the sapphire substrate 1.

Next, in the step shown in FIG. 16B, chemical mechanical polishing (CMP) is performed until the top surface of the sapphire substrate 1 is exposed, whereby the SiO$_2$ film 2x and the sapphire substrate 1 are flattened at the top. This forms a protector film 2 having a ring width of approximately 1 μm which covers the side surface of the sapphire substrate 1.

Then, in the step shown in FIG. 16C, a GaN film 3 having a thickness of approximately 300 μm is grown through epitaxial growth on the top surface of the sapphire substrate 1 under the same procedure and condition as in the first embodiment. At this point, the GaN crystal is also laterally grown sideways along the top surface of the protector film 2. This gives the GaN film 3 a diameter larger than the outer diameter of the sapphire substrate 1 (approximately 50.8 mm in the present embodiment).

Next, the wafer is taken out of the reactor furnace of the HVPE apparatus. Under the same procedure and condition as in the first embodiment, the GaN film 3 is irradiated with a beam of laser light from the back surface of the sapphire substrate 1. The beam of laser light is scanned over the entire surface of the wafer, so that the free-standing GaN film 3 (GaN wafer) separated from the sapphire substrate 1 is obtained as in the first embodiment.

In this modified example, the closed-ring protector film 2 which covers only the side surface of the sapphire substrate 1 is formed in advance through $SiO_2$ film deposition and CMP. This protector film 2 is left intact while the GaN film 3, a nitride semiconductor film, is grown through epitaxial growth on the sapphire substrate 1 where not covered by the protector film 2. Since no GaN crystal grows on the side surface of the sapphire substrate 1, the GaN film 3 can be surely decomposed at its entire back surface which is in contact with the sapphire substrate 1 and the protector film 2. Accordingly, as in the first embodiment, the GaN film 3 and the sapphire substrate 1 can be separated from each other smoothly, and a free-standing GaN wafer (nitride semiconductor wafer) can be obtained with excellent reproducibility.

Like the modified example 4, this modified example also has the advantage that the free-standing GaN wafer having a nearly flat back surface can be obtained without polishing the back surface of the GaN film 3 in particular.

There is another advantage that after the separation of the GaN film 3 and the sapphire substrate 1, the sapphire substrate 1 having the protector film 2 thereon can be recycled through brief CMP alone.

Note that the modified example 4 can secure a protector film 2 of greater width (approximately 2 mm in the foregoing modified example 4) without increasing the protector film in thickness. Therefore, when compared to the modified example 5, the modified example 4 can achieve a compound semiconductor wafer of good quality that is still less susceptible to variations in the epitaxial growth condition around the side surface of the sapphire substrate 1.

(Second Embodiment)

According to the first embodiment and each modified example thereof, in the step shown in FIG. 1B, the inside of the closed ring portion 2a of the protector film 2 is opened entirely, and hence, of the sapphire substrate 1, the portion located inside the closed ring portion 2a is exposed entirely. It should be appreciated, however, that the manufacturing method of the present invention is not necessarily limited to the methods according to the first embodiment and each modified example thereof.

Figure 5A:
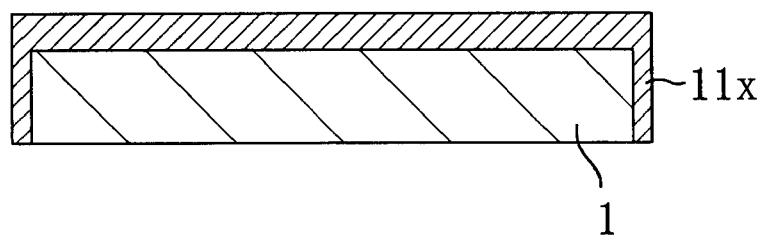
FIGS. 5A through 5C are cross sections showing manufacturing steps of a compound semiconductor wafer according to a second embodiment of the present invention.
Figure 5B:
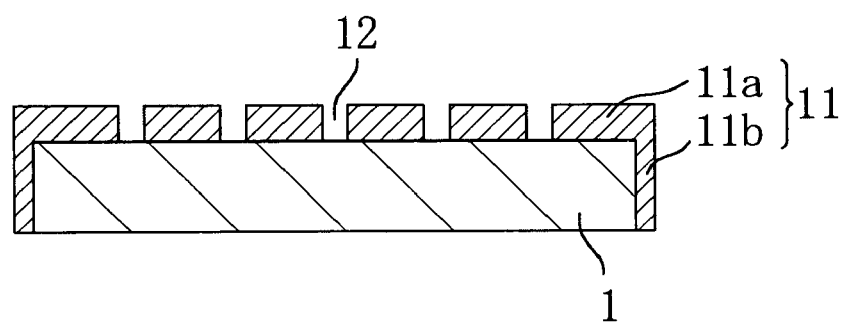
Figure 5C:
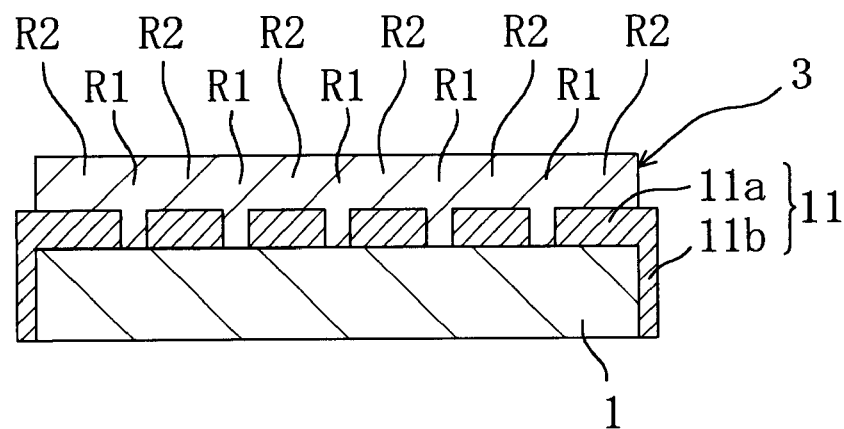

FIGS. 5A through 5C are cross sections showing the manufacturing steps of a compound semiconductor wafer according to a second embodiment of the present invention. In the description of the present embodiment, plan views are omitted for ease of explanation.

Initially, in the step shown in FIG. 5A, an $SiO_2$ film 11x having a thickness of approximately 100 nm is formed by means of CVD on the surface of a sapphire substrate 1 (sapphire wafer) having a diameter of approximately 50.8 mm and a thickness of approximately 300 $\mu$m. At this point, the $SiO_2$ film 11x covers the top surface and the side surface of the sapphire substrate 1.

Then, in the step shown in FIG. 5B, the $SiO_2$ film 11x is patterned by means of photolithography and dry etching, whereby formed from the $SiO_2$ film 11x is a protector film 11 composed of a top surface portion 11a covering a part of the top surface of the sapphire substrate 1 and a side surface portion 11b covering the side surface of the sapphire substrate 1. At this point, the top surface portion 11a not only has a closed ring portion identical with the one in the first embodiment, but also covers almost entirely the top surface of the sapphire substrate 1 inside the closed ring portion. Further, the top surface portion 11a of the protector film 11 is provided with holes 12 having a diameter of approximately 2 $\mu$m with a spacing of approximately 10 $\mu$m and arranged two-dimensionally.

Then, in the step shown in FIG. 5C, the sapphire substrate 1 provided with the protector film 11 is set in a reactor furnace of an HVPE apparatus, and from the upstream end of the reactor furnace, a GaCl gas produced by Ga metal and a HCl gas and an ammonia gas ($NH_3$) are supplied as raw material gases and a nitrogen gas ($N_2$) is supplied as a carrier gas while the sapphire substrate 1 is kept heated at approximately 1000° C. Consequently, in approximately seven and a half hours, a GaN film 3 having a thickness of approximately 300 $\mu$m is grown through epitaxial growth on the top surface of the sapphire substrate 1 at exposed portions. At this point, once the GaN crystals are grown upward through epitaxial growth within each hole 12 to reach the top surface of the protector film 11, the GaN crystals are then grown through lateral growth toward the side surface along the top surface of the protector film 11. Hence, the GaN crystals grown through lateral growth are eventually combined with each other above each hole 12, thereby forming a continuous GaN film 3.

At this point, the GaN film 3 has a defect, such as a dislocation of some extent caused by a lattice misfit with the sapphire substrate 1. Also, a defect, such as a dislocation, is propagated through the GaN film 3 in a portion grown through epitaxial growth in a vertical direction above the holes 12. On the contrary, a defect, such as a dislocation, is seldom propagated through the GaN film 3 in a portion located above the protector film 11, because this portion is grown through lateral growth, thereby maintaining high crystallinity.

Although the drawing omits the steps thereafter, like in the first embodiment, the wafer is taken out from the reactor furnace of the HVPE apparatus and a beam of laser light, herein the third harmonics having a wavelength of 355 nm from a Nd/YAG laser, is irradiated to the GaN film 3 from the back surface of the sapphire substrate 1. Then, by scanning a beam of laser light on the surface of the wafer entirely, the free-standing GaN film 3 (GaN wafer) separated from the sapphire substrate 1 is obtained. The conditions specified in the first embodiment are also applied herein.

According to the present embodiment, basically, the operations and advantages same as those of the first embodiment can be exerted. In addition, because the GaN film 3 is formed by conducting epitaxial growth of the GaN crystals from the opening portions of the protector film 11 while a major part of the top surface of the sapphire substrate 1 is covered with the protector film 11, and then conducting lateral growth of the GaN crystals along the top surface of the protector film 11, it is possible to form a good-quality crystalline layer, through which a defect, such as a dislocation, is seldom propagated in the portions grown above the protector film 11. Consequently, a density of defects in the entire GaN film 3 can be lowered.

(Third Embodiment)

In the first embodiment, the outer circumference portion of the sapphire substrate 1 is covered with the protector film 2 made of $SiO_2$. It should be appreciated, however, that the protector film 2 does not have to cover the outer circumference portion or the side surface of the sapphire substrate 1.

Figure 6A:
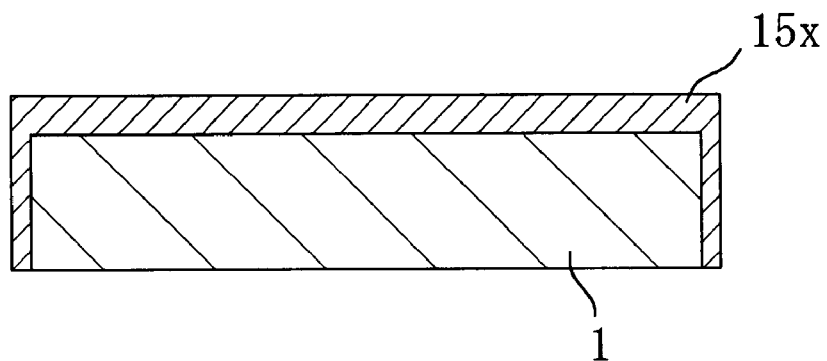
FIGS. 6A through 6C are cross sections showing manufacturing steps of a compound semiconductor wafer according to a third embodiment of the present invention.
Figure 6B:
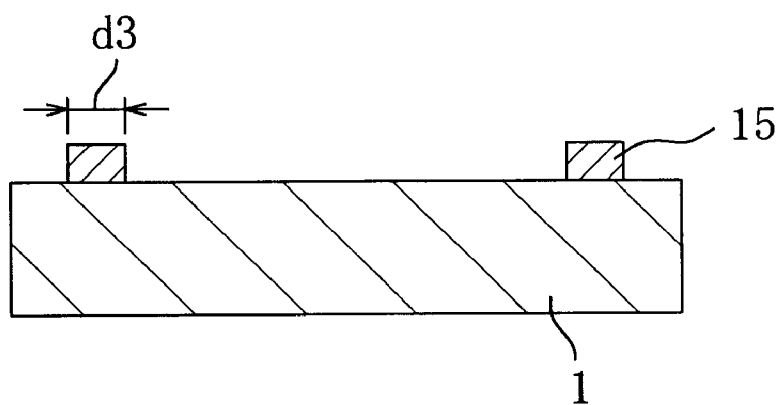
Figure 6C:
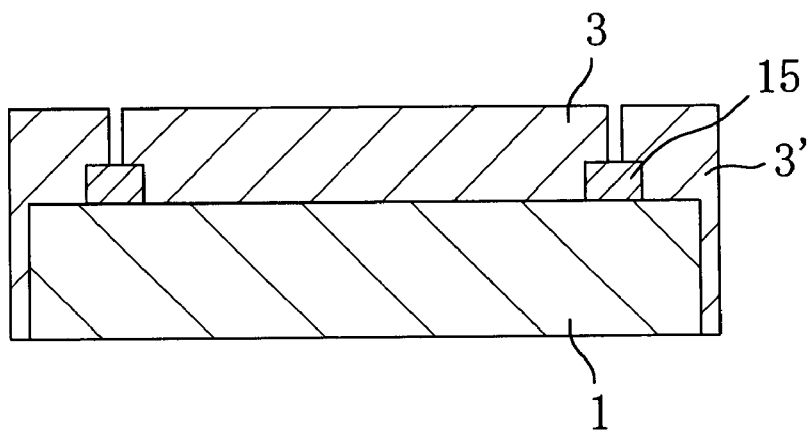

FIGS. 6A through 6C are cross sections showing the manufacturing steps of a compound semiconductor wafer according to a third embodiment of the present invention. In the description of the present embodiment, plan views are omitted for ease of explanation.

Initially, in the step shown in FIG. 6A, an $SiO_2$ film 15x having a thickness of approximately 100 nm is formed by means of CVD on the surface of a sapphire substrate 1 (sapphire wafer) having a diameter of approximately 50.8 mm and a thickness of approximately 300 μm. At this point, the SiO$_2$ film 15x covers the top surface and side surface of the sapphire substrate 1.

Then, in the step shown in FIG. 6B, the SiO$_2$ film 15x is patterned by means of photolithography and dry etching, whereby formed from the SiO$_2$ film 15x is a closed-ring protector film 15 having a ring width d3 and covering a part of the top surface of the sapphire substrate 1. At this point, portions of the SiO$_2$ film 15x on the side surface and on the outer circumference portion adjacent to the side surface of the sapphire substrate 1 are removed.

Then, in the step shown in FIG. 6C, the sapphire substrate 1 provided with the protector film 15 is set in a reactor furnace of an HVPE apparatus, and from the upstream end of the reactor furnace, a GaCl gas produced by Ga metal and a HCl gas and an ammonia gas (NH$_3$) are supplied as raw material gases and a nitrogen gas (N$_2$) is supplied as a carrier gas while the sapphire substrate 1 is kept heated at approximately 1000° C. Consequently, in approximately seven and a half hours, a GaN film 3 having a thickness of approximately 300 μm is grown through epitaxial growth on the top surface of the sapphire substrate 1 at an exposed portion. At this point, the GaN film 3 that will be used as an underlying substrate is grown on the top surface of the sapphire substrate 1 from a portion located inside the protector film 15, and a GaN film 3' that will not be used is grown on the top surface of the sapphire substrate 1 from a portion located outside the protector film 15 and from the sides surface thereof. When the thickness of each of the GaN films 3 and 3' exceeds the thickness of the protector film 15, the GaN films 3 and 3' are then grown through lateral growth along the top surface of the protector film 15. Herein, the epitaxial growth is stopped before the GaN films 3 and 3' that are grown through lateral growth respectively from the outer circumference portion and inner circumference portion of the protector film 15 come in contact with each other.

Although the drawing omits the steps thereafter, like in the first embodiment, the wafer is taken out from the reactor furnace of the HVPE apparatus and a beam of laser light, herein the third harmonics having a wavelength of 355 nm from a Nd/YAG laser, is irradiated to the GaN film 3 from the back surface of the sapphire substrate 1. Then, by scanning a beam of laser light on the surface of the wafer entirely, the free-standing GaN film 3 (GaN wafer) separated from the sapphire substrate 1 is obtained. The conditions specified in the first embodiment are also applied herein.

In the above description, the sapphire substrate 1 is separated by irradiation of laser light. However, the method of removing the sapphire substrate 1 according to the present invention is not limited to the one discussed in the embodiments above, and polishing is also applicable as the removing method. In addition, in a case where an Si substrate or a GaAs substrate is used instead of the sapphire substrate, etching is also applicable as the removing method.

In the present embodiment, the ring width d3 of the protector film 15 also has to be larger than the film thickness of the GaN film 3.

In the present embodiment, the protector film 15 having the outer diameter smaller than the diameter of the sapphire substrate 1 is formed and two GaN films 3 and 3' are provided separately, and then only the GaN film 3 inside the protector film 15 is used as a free-standing GaN wafer. Hence, according to the present embodiment, by using the protector film 15, it is possible to achieve the advantages attained in the first embodiment.

In addition, when polishing is adopted as the method of removing the sapphire substrate 1, in particular, the present embodiment can offer an extra advantage as follows. That is, when the sapphire substrate 1 is polished, the presence of the GaN film 3' formed outside the protector film 15 comparatively lessens mechanical stress applied to the GaN film 3 formed inside the protector film 15. Hence, it is possible to control the occurrence of a breaking of the GaN film 3, which is a free-standing GaN wafer.

In the first through third embodiments (including the modified examples), the SiO$_2$ film is used as the protector film that interferes with the epitaxial growth of the GaN film 3. It should be appreciated, however, that materials forming the protector film of the present invention are not limited to the one discussed in each embodiment above. Besides the SiO$_2$ film (silicon dioxide film), a silicon nitride film (SiN film), a silicon oxynitride film (SiON film), a refractory metal film (W film, Mo film, Ta film, Co film, Ti film, etc.) are also applicable.

Also, the size of the free-standing wafer manufactured by the present invention is not limited to the size specified in the first through third embodiments (including modified examples), and as the wafer increases in size, the achieved advantages become more noticeable in comparison with the prior art. Above all, it has been difficult to obtain a free-standing wafer of a size approximately 5 mm square or larger with satisfactory reproducibility by the conventional method. However, by using the technique of the present invention, it is possible to obtain a free-standing wafer of the above size with satisfactory reproducibility.

(Fourth Embodiment)

FIGS. 7A through 7E are longitudinal sections and plan views showing a manufacturing method of a compound semiconductor wafer according to a fourth embodiment of the present invention. In FIGS. 7A through 7E, a sapphire substrate and a GaN film are illustrated as circles, but it is general that an orientation flat that indicates the wafer's crystal orientation is provided at a part thereof. Even in such a case, the same advantages can be achieved by the present embodiment. Hence, in the following description, it is assumed that the term "circle" includes a case where the orientation flat is provided.

Figure 7A:
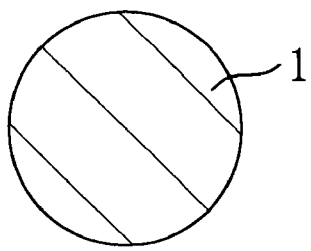
FIGS. 7A through 7E are longitudinal sections and plan views showing a manufacturing method of a compound semiconductor wafer according to a fourth embodiment of the present invention.
Figure 7A:
Figure 7B:
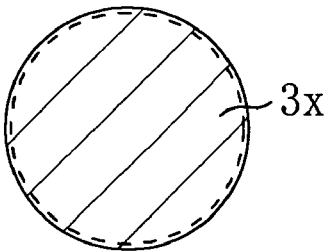
Figure 7B:
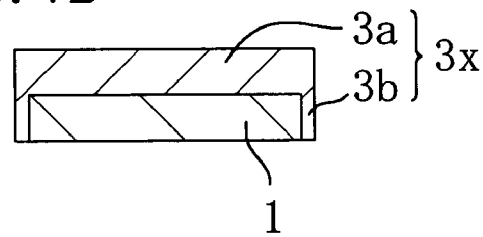

Initially, in the step shown in FIG. 7A, a sapphire substrate 1 (sapphire wafer) having a diameter of approximately 50.8 mm and a thickness of approximately 300 μm is prepared. Then, in the step shown in FIG. 7B, the sapphire substrate 1 is set in a reactor furnace of an HVPE apparatus, and from the upstream end of the reactor furnace, a GaCl gas produced by Ga metal and a HCl gas and an ammonia gas (NH$_3$) are supplied as raw material gases and a nitrogen gas (N$_2$) is supplied as a carrier gas while the sapphire substrate 1 is kept heated at approximately 1000° C. Consequently, in approximately seven and a half hours, a GaN film 3x having a thickness of approximately 300 μm is grown through epitaxial growth on the surface of the sapphire substrate 1. At this point, the GaN film 3x has a portion 3a covering the top surface of the sapphire substrate 1 and a portion 3b covering the side surface of the sapphire substrate 1.

Figure 7C:
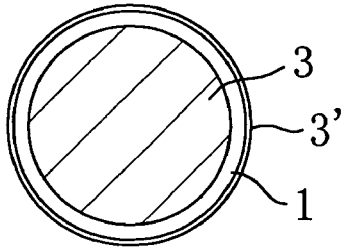
Figure 7C:
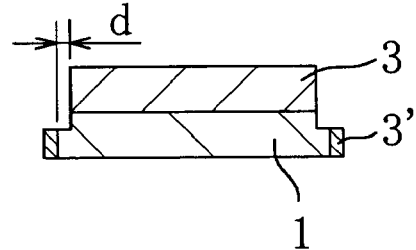

Next, in the step shown in FIG. 7C, the wafer is taken out from the reactor furnace of the HVPE apparatus and the outer circumference portion of the wafer is polished, whereby the outer circumference portion of the GaN film 3x is removed, and at the same time, the outer circumference portion of the sapphire substrate 1 is carved into a certain depth. Consequently, the outer circumference portion of the sapphire substrate 1 has a step-wise shape, and the GaN film 3x is divided into a GaN film 3 located also on the top surface of the sapphire substrate 1 and a GaN film 3' located on the side surface of the sapphire substrate 1 alone.

Figure 7D:
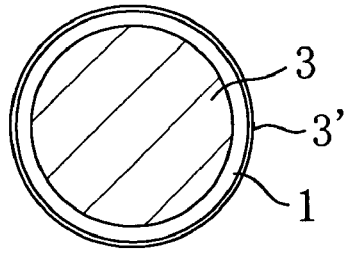
Figure 7D:
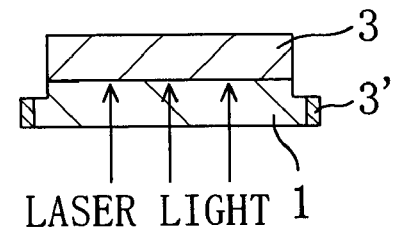

Then, in the step shown in FIG. 7D, a beam of laser light, herein the third harmonics having a wavelength of 355 nm from a Nd/YAG laser, is irradiated to the GaN film 3 from the back surface of the sapphire substrate 1. The absorption edge wavelength of GaN is approximately 360 to 370 nm, which is longer than the wavelength of the laser light, and therefore, GaN absorbs the laser light and generates heat. By increasing the energy density of the laser light satisfactorily, the GaN film 3 at a portion in contact with the sapphire substrate 1, that is, the back surface portion thereof, is decomposed due to the heat generation in the vicinity of the interface. In the present embodiment, such a phenomenon can be confirmed when the energy density of the laser light is nearly 0.4 J/cm$^2$ or higher.

Figure 7E:
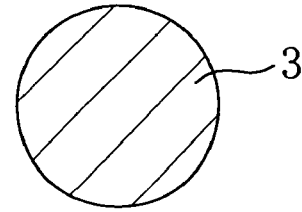
Figure 7E:
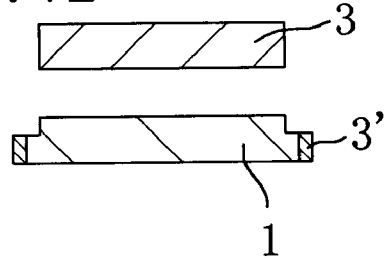

By scanning a beam of laser light on the surface of the wafer entirely under the above conditions, the free-standing GaN film 3 (GaN wafer) separated from the sapphire substrate 1 as shown in FIG. 7E is obtained.

Figure 8:
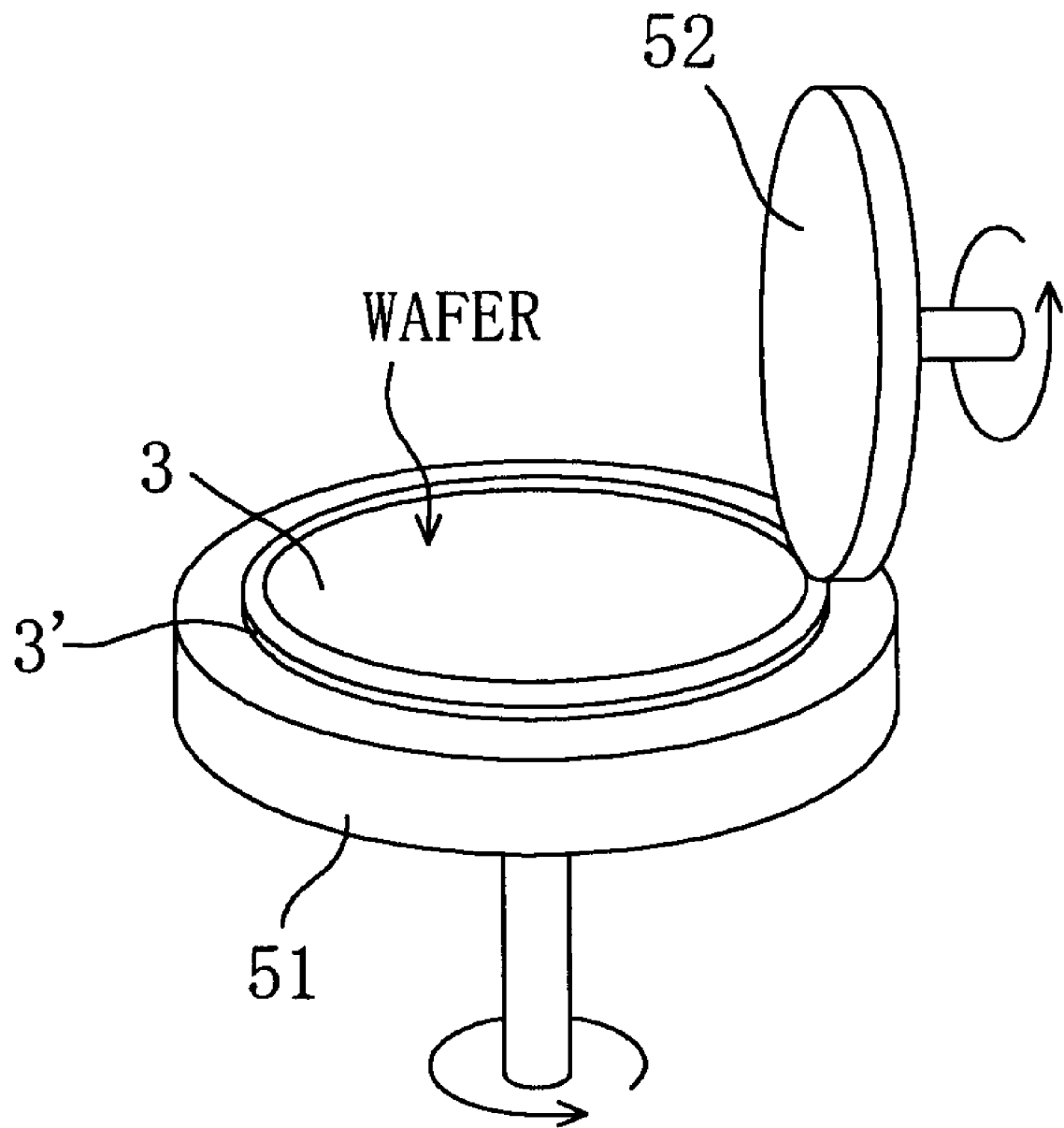
FIG. 8 is a perspective view schematically showing a polishing step shown in FIG. 7C.

FIG. 8 is a perspective view schematically showing the polishing step shown in FIG. 7C. As shown in the drawing, a polishing device includes a rotary stage 51 having an axis of rotation in an almost vertical direction, and a polishing plate 52 having an axis of rotation producing an angle of 90 degrees with respect to the axis of rotation of the rotary stage 51. Herein, the wafer is fixed onto the rotary stage 51, and the polishing plate 52, which is turning at a high speed, is pressed against the outer circumference portion of the wafer. By rotating the rotary stage 51 slowly under these conditions, the outer circumference portion of the GaN film 3x is removed, thereby dividing the same into the separate GaN films 3 and 3'.

In the above description, the sapphire substrate 1 is separated by irradiation of laser light. However, the method of removing the sapphire substrate 1 according to the present invention is not limited to the one discussed in the embodiments above, and polishing is also applicable as the removing method. In addition, in a case where an Si substrate or a GaAs substrate is used instead of the sapphire substrate, etching is also applicable as the removing method.

In the present embodiment, the advantages same as those of the third embodiment can be also exerted. To be more specific, in addition to the advantage of the first embodiment, in case that the sapphire substrate 1 is separated by means of polishing, the presence of the GaN film 3' formed on the side surface of the sapphire substrate 1 comparatively lessens mechanical stress applied to the GaN film 3 formed on the top surface of the sapphire substrate 1. Hence, it is possible to control the occurrence of a breaking of the GaN film 3, which is a free-standing GaN wafer.

(Fifth Embodiment)

Figure 9A:
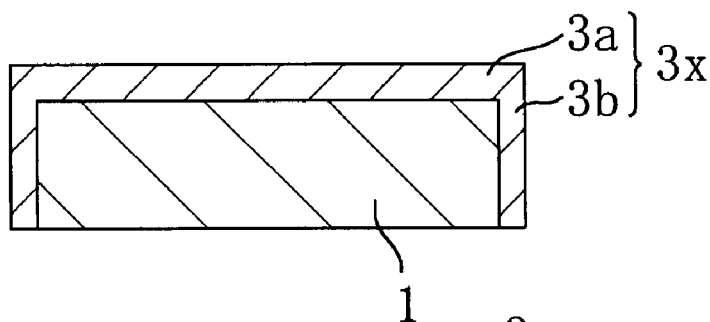
FIGS. 9A through 9C are cross sections showing a manufacturing method of a compound semiconductor wafer according to a fifth embodiment of the present invention.
Figure 9B:
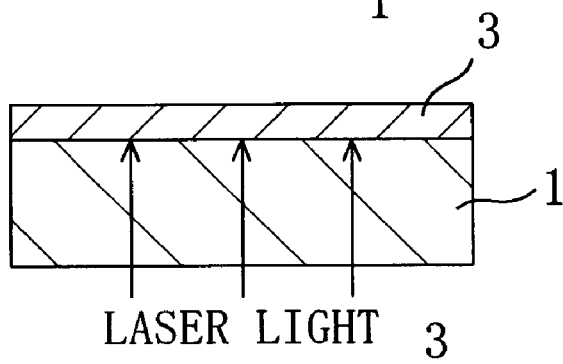
Figure 9C:
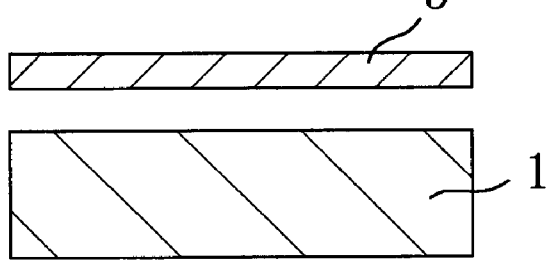

FIGS. 9A through 9C are cross sections showing a manufacturing method of a compound semiconductor wafer according to a fifth embodiment of the present invention. In the description of the present embodiment, plan views of the wafer are omitted for ease of explanation.

Initially, in the step shown in FIG. 9A, a sapphire substrate 1 (sapphire wafer) having a diameter of approximately 50.8 mm and a thickness of approximately 300 μm is prepared. Then, the sapphire substrate 1 is set in a reactor furnace of an HVPE apparatus, and from the upstream end of the reactor furnace, a GaCl gas produced by Ga metal and a HCl gas and an ammonia gas (NH$_3$) are supplied as raw material gases and a nitrogen gas (N$_2$) is supplied as a carrier gas while the sapphire substrate 1 is kept heated at approximately 1000° C. Consequently, in approximately seven and a half hours, a GaN film 3x having a thickness of approximately 300 μm is grown through epitaxial growth on the surface of the sapphire substrate 1. At this point, the GaN film 3x has a portion 3a covering the top surface of the sapphire substrate 1 and a portion 3b covering the side surface of the sapphire substrate 1.

Next, in the step shown in FIG. 9B, the wafer is taken out from the reactor furnace of the HVPE apparatus and the outer circumference portion of the wafer is polished, whereby the outer circumference portion and the side surface portion of the GaN film 3x is removed, and at the same time, the outer circumference portion of the sapphire substrate 1 is removed. Consequently, the GaN film 3 located on the top surface of the sapphire substrate 1 alone is left.

Then, in the step shown in FIG. 9C, third harmonics (wavelength: 355 nm) from a Nd/YAG laser is irradiated to the GaN film 3 from the back surface of the sapphire substrate 1. The Nd/YAG laser has a pulse width of 5 ns, a light intensity of 300 mJ/cm$^2$, and a beam spot of 7 mm. Because the Nd/YAG laser has an extremely short pulse width as small as 5 ns, the laser light is absorbed locally at a region in close proximity to the interface of the GaN film 3 and the sapphire substrate 1. By increasing the energy density of the laser light satisfactorily, the GaN film 3 at a portion in contact with the sapphire substrate 1, that is, the back surface portion thereof, is decomposed due to the heat generation in the vicinity of the interface. In the present embodiment, such a phenomenon can be confirmed when the energy density of the laser light is nearly 0.4 J/cm$^2$ or higher.

By scanning a beam of laser light on the surface of the wafer entirely under the above conditions, the free-standing GaN film 3 (GaN wafer) separated from the sapphire substrate 1 is obtained.

Figure 10:
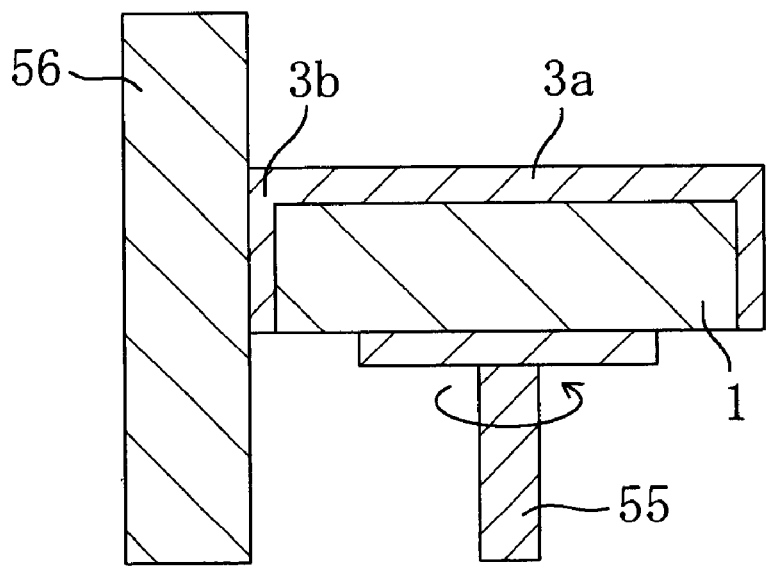
FIG. 10 is a perspective view schematically showing a polishing step shown in FIG. 9B.

FIG. 10 is a perspective view schematically showing the polishing step shown in FIG. 9B. As shown in the drawing, a polishing device includes a rotary stage 55 having an axis of rotation in an almost vertically direction, and a polishing plate 56. For example, a diamond wheel is used as the polishing plate 56. Herein, the wafer is fixed onto the rotary stage 55, and the polishing plate 56 is pressed against the outer circumference portion of the wafer. By rotating the rotary stage 55 slowly under these conditions, the outer circumference portions of the GaN film 3x and the sapphire substrate 1 are removed. In order to forestall a crack or a breaking of the GaN film during the laser lift-off process performed in the following step, it is sufficient to remove only the portion 3b, which is a portion of the GaN film 3x located on the side surface of the sapphire substrate 1. However, the side surface of the sapphire substrate 1 may be also polished to some extent as is in the present embodiment. It should be noted, however, that it is more preferable to remove the portion 3b of the GaN film 3x alone without removing the sapphire substrate 1.

In the present embodiment, the advantages same as those of the first embodiment can be also exerted. Further, in addition to the advantages of the first embodiment, because the GaN film 3, which is a free-standing wafer, has a flat back surface, there is another advantage that it is not necessary to polish the back surface as is in the first embodiment.

Moreover, there is still another advantage that the plane dimension of the GaN film 3, which is a finished GaN wafer, is substantially equal to the plane dimension of the sapphire substrate 1. In other words, by selecting the size of the sapphire substrate 1, it is possible to obtain a GaN wafer of a desired size.

(Sixth Embodiment)

FIGS. 11A through 11D are cross sections showing a manufacturing method of a compound semiconductor wafer according to a sixth embodiment of the present invention. In the description of the present embodiment, plan views of the wafer are omitted for ease of explanation.

Figure 11A:
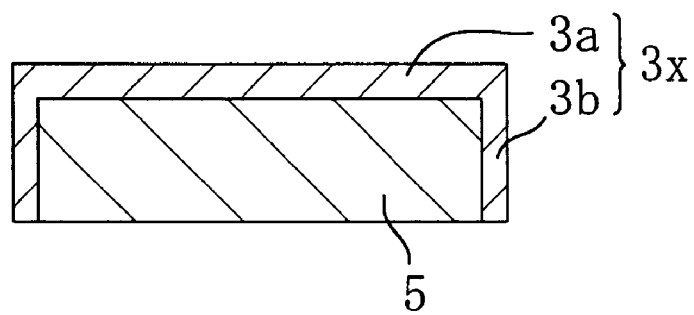
FIGS. 11A through 11D are cross sections showing a manufacturing method of a compound semiconductor wafer according to a sixth embodiment of the present invention.

Initially, in the step shown in FIG. 11A, a GaAs substrate 5 (GaAs wafer) having a diameter of approximately 50.8 mm and a thickness of approximately 300 μm is prepared. Then, the GaAs substrate 5 is set in a reactor furnace of an HVPE apparatus, and from the upstream end of the reactor furnace, a GaCl gas produced by Ga metal and a HCl gas and an ammonia gas ($NH_3$) are supplied as raw material gases and a nitrogen gas ($N_2$) is supplied as a carrier gas while the GaAs substrate 5 is kept heated at approximately 1000° C. Consequently, in approximately five hours, a GaN film 3x having a thickness of approximately 200 μm is formed on the surface of the GaAs substrate 5. At this point, the GaN film 3x has a portion 3a covering the top surface of the GaAs substrate 5 and a portion 3b covering the side surface of the GaAs substrate 5. At this point, the film thickness of the portion 3b of the GaN film 3x located on the side surface of the GaAs substrate 5, and the film thickness of the portion 3a of the GaN film 3x located on the top surface of the GaAs substrate 5 are substantially equal.

Figure 11B:
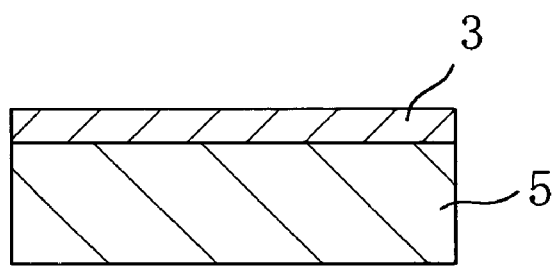

Next, in the step shown in FIG. 11B, the wafer is taken out from the reactor furnace of the HVPE apparatus and the outer circumference portion of the wafer is polished, whereby the outer circumference portion and the side surface portion of the GaN film 3x are removed, and at the same time, the outer circumference portion of the GaAs substrate 5 is removed. Consequently, a GaN film 3 located on the top surface of the GaAs substrate 5 alone is left. At this point, the side surface of the GaAs substrate 5 may be polished to some extent as is in the present embodiment. It should be noted, however, that it is more preferable to remove only the portion 3b of the GaN film 3x without removing the GaAs substrate 5.

Figure 11C:
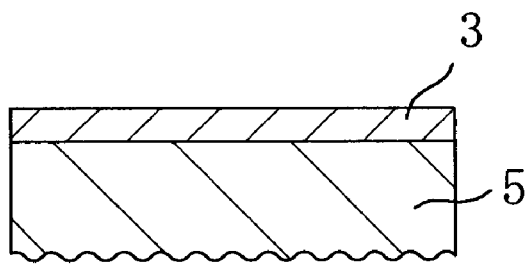
Figure 11D:

Then, in the step shown in FIG. 11C, the GaAs substrate 5 is removed by means of polishing. Consequently, the GaN film 3 as shown in FIG. 11D, which is a free-standing GaN wafer, is obtained. At this point, it is preferable to use fine powder of diamond, SiC, etc. as abrasive. By using abrasive with a smaller particle size in the finish polishing, it is possible to make the back surface of the GaN film 3, which is the free-standing wafer, into a flat mirror surface.

A sapphire substrate, an SiC substrate, a diamond substrate, etc. may be used instead of the GaAs substrate 5. It should be noted, however, that in the case of the GaAs substrate or Si substrate, the substrate may be removed by means of etching instead of polishing.

In the present embodiment, the advantages same as those of the first embodiment can be also exerted. Further, in addition to the advantages of the first embodiment, there is another advantage that the plane dimension of the GaN film 3, which is a finished GaN wafer, is substantially equal to the plane dimension of the GaAs substrate 5. In other words, by selecting the size of the GaAs substrate 5, it is possible to obtain a GaN wafer of a desired size.

(Seventh Embodiment)

Figure 12A:
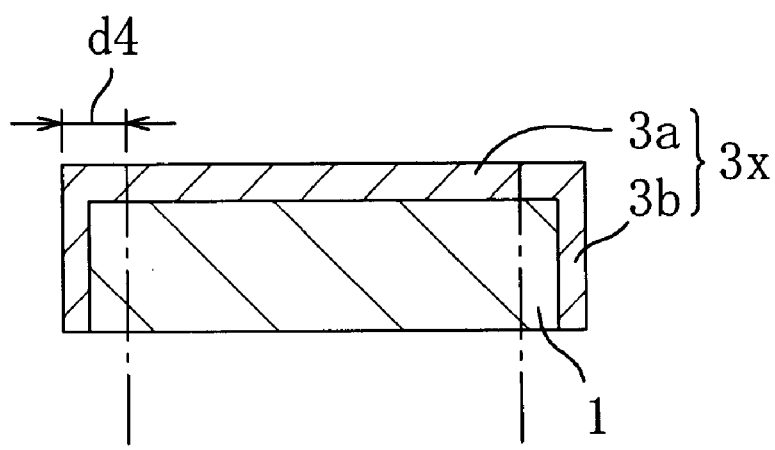
FIGS. 12A through 12C are cross sections showing a manufacturing method of a compound semiconductor wafer according to a seventh embodiment of the present invention.
Figure 12B:
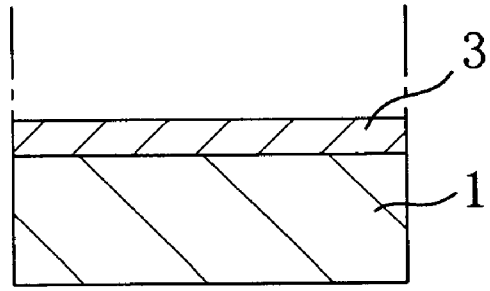
Figure 12C:
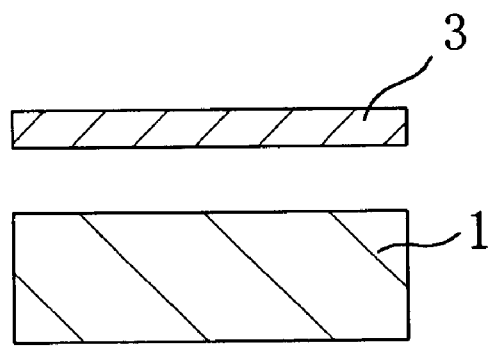
Figure 13A:
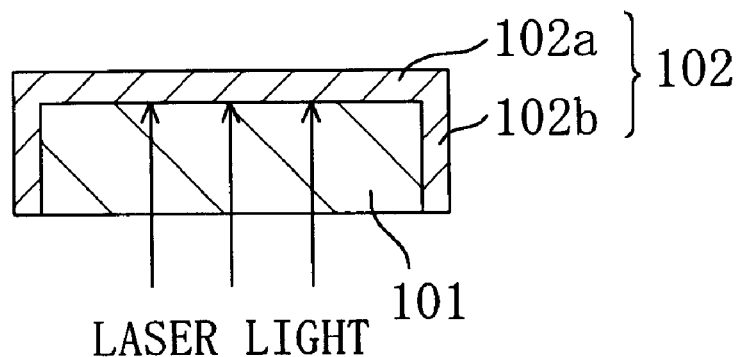
FIGS. 13A and 13B are cross sections showing steps of forming a conventional free-standing nitride semiconductor film.
Figure 13B:
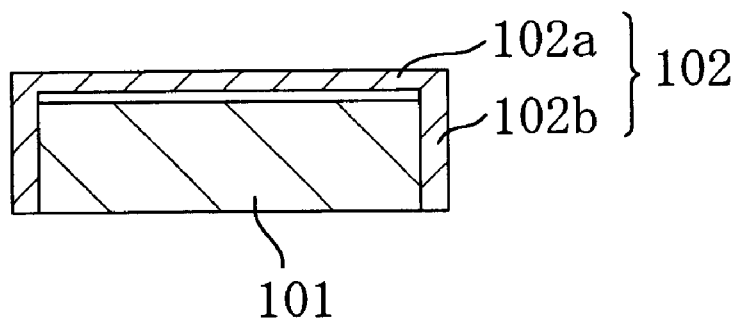

FIGS. 12A through 12C are cross sections showing a manufacturing method of a compound semiconductor wafer according to a seventh embodiment of the present invention. In the description of the present embodiment, plan views of the wafer are omitted for ease of explanation.

Initially, in the step shown in FIG. 12A, a sapphire substrate 1 (sapphire wafer) having a diameter of approximately 50.8 mm and a thickness of approximately 300 μm is prepared. Then, the sapphire substrate 1 is set in a reactor furnace of an HVPE apparatus, and from the upstream end of the reactor furnace, a GaCl gas produced by Ga metal and a HCl gas and an ammonia gas ($NH_3$) are supplied as raw material gases and a nitrogen gas ($N_2$) is supplied as a carrier gas while the sapphire substrate 1 is kept heated at approximately 1000° C. Consequently, in approximately five hours, a GaN film 3x having a thickness of approximately 200 μm is grown through epitaxial growth on the surface of the sapphire substrate 1. At this point, the GaN film 3x has a portion 3a covering the top surface of the sapphire substrate 1 and a portion 3b covering the side surface of the sapphire substrate 1.

Next, in the step shown in FIG. 12B, the wafer is taken out from the reactor furnace of the HVPE apparatus and the outer circumference portion of the wafer is cut in a closed-ring shape, whereby the outer circumference portion and the side surface portion of the GaN film 3x are removed, and at the same time, the outer circumference portion of the sapphire substrate 1 is removed. Consequently, a GaN film 3 located on the top surface of the sapphire substrate 1 alone is left.

At this point, cleavage or a diamond cutter is preferably used as means of cutting the wafer. In case that the diamond cutter is used to cut the wafer, a method of cutting the wafer in a polygonal and a method of cutting the wafer in a circle are applicable. Removing a too large quantity by means of cutting is not preferable because the area of the GaN wafer becomes too small. Thus, a width d4 of the outer circumference portion that has poor crystallinity and hence needs to be removed is studied by changing a flow rate, pressure, etc. of the raw material gases, and approximately 7.5 mm is obtained as the maximum value. It is assumed that the width d4 is determined from a diffusing process of the raw material gases throughout a reaction tube. Hence, as one of the conditions of the present embodiment, it is preferable to give 7.5 mm or less as the width d4 of the outer circumference portion to be removed by means of cutting. It should be appreciated, however, that an appropriate width d4 may change depending on the conditions, such as the outer diameter of the wafer, the kinds and a flow quantity of the gases, etc.

Then, in the step shown in FIG. 12C, third harmonics (wavelength: 355 nm) from a Nd/YAG laser is irradiated to the GaN film 3 from the back surface of the sapphire substrate 1. The Nd/YAG laser has a pulse width of 5 ns, a light intensity of 300 mJ/cm$^2$, and a beam spot of 7 mm. Because the Nd/YAG laser has an extremely short pulse width as small as 5 ns, the laser light is absorbed locally at a region in close proximity to the interface of the GaN film 3 and the sapphire substrate 1. By increasing the energy density of the laser light satisfactorily, the GaN film 3 at a portion in contact with the sapphire substrate 1, that is, the back surface portion thereof, is decomposed due to the heat generation in the vicinity of the interface. In the present embodiment, such a phenomenon can be confirmed when the energy density of the laser light is nearly 0.4 J/cm$^2$ or higher.

By scanning a beam of laser light on the surface of the wafer entirely under the above conditions, the free-standing GaN film 3 (GaN wafer) separated from the sapphire substrate 1 is obtained.

In the present embodiment, the advantages same as those of the first embodiment can be also exerted. In the present embodiment, the GaN wafer has a smaller area than the pretreatment sapphire substrate 1. Thus, by making the sapphire substrate 1 slightly larger to allow for a reduction in area, it is possible to obtain a free-standing GaN wafer of a desired size.

EXAMPLE

The present example will describe a light emitting diode fabricated by using the GaN wafer (GaN film 3) manufactured in the seventh embodiment above.

Figure 14A:
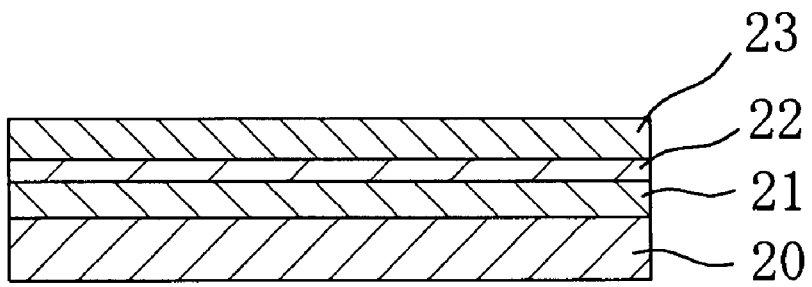
FIGS. 14A through 14C are cross sections showing manufacturing steps of a light emitting diode according to an example of the seventh embodiment of the present invention.
Figure 14B:
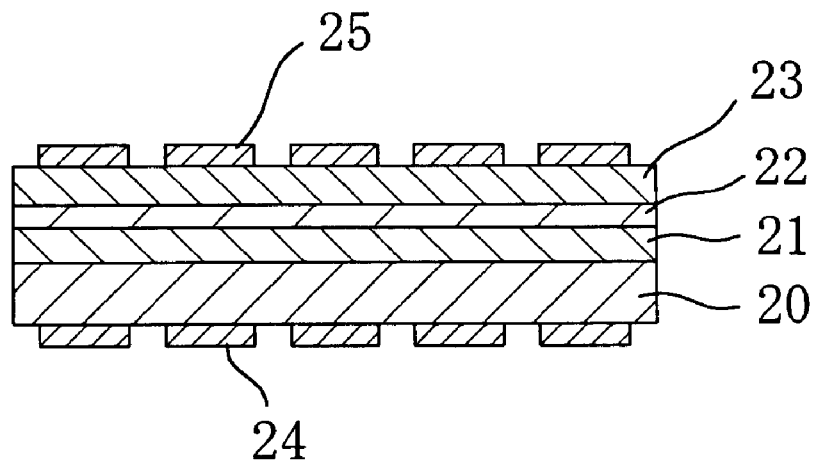
Figure 14C:
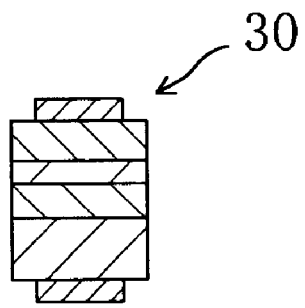

FIGS. 14A through 14C are cross sections showing manufacturing steps of a light emitting diode according to an example of the seventh embodiment of the present invention.

Initially, in the step shown in FIG. 14A, an n-type GaN crystalline film 21 having a thickness of approximately 4 $\mu$m is grown through epitaxial growth on the GaN wafer 20 by using a metal organic vapor phase epitaxy apparatus. Herein, a growing temperature is 1030° C., trimethylgallium is used as a Ga material, and $NH_3$ is used as a N material. Also, $SiH_4$ is used as a raw material of Si serving as a donor impurity, and $H_2$ is used as a carrier gas. Then, the carrier gas is switched to $N_2$ and the growing temperature is lowered to 800° C., whereby an n-type InGaN crystalline film 22 having a thickness of approximately 20 nm is grown through epitaxial growth on the n-type GaN crystalline film 21. Herein, trimethylindium is used as a raw material of In. Subsequently, the growing temperature is raised again to 1020° C., whereby a p-type GaN crystalline film 23 having a thickness of approximately 800 nm is grown through epitaxial growth. Herein, cyclopentadienylmagnesium is used as a raw material of Mg serving as an acceptor impurity.

Then, in the step shown in FIG. 14B, after the p-type GaN crystalline film 23 is grown through epitaxial growth, the GaN wafer is subjected to annealing at 700° C. for 20 minutes in an nitrogen atmosphere by an annealing device, so that resistance of the uppermost p-type GaN crystalline film 23 is further reduced.

Then, after the annealing, a Ti/Al back surface electrode 24 of a multi-layer structure is formed on the back surface of the GaN wafer 20, and an Ni/Au electrode 23 is formed on the p-type GaN crystalline film 23, respectively, as an ohmic electrode.

Subsequently, in the step shown in FIG. 14C, the wafer is cut, and divided into chips 30 of 500 $\mu$m square, each of which is used as a light emitting diode.

An evaluation of characteristics of these light emitting diode reveals that quite satisfactory characteristics are obtained on the entire substrate.

A compound semiconductor wafer (GaN wafer) manufactured by the conventional manufacturing method includes a portion grown from the side surface of the substrate (sapphire substrate or GaAs substrate), and for this reason, a light emitting diode formed at the outer circumference of the wafer cannot attain satisfactory characteristics. In addition, when the GaN film (compound semiconductor wafer) manufactured by the conventional manufacturing method is used, a chipping occurs in the outer circumference portion or the side surface portion of the GaN film during the process, and debris adhere to the surface of the GaN film. As a result, there is a portion, on which deterioration of the diode characteristics is observed, other than the GaN film formed on the outer circumference portion and the side surface of the substrate.

In view of the foregoing results, it is understood that by removing the outer circumference portion of the GaN film, it is possible to enhance a yield of the light emitting diodes or semiconductor lasers.

(Other Embodiments)

In each of the embodiments above, the GaN film 3 may be formed after a low-temperature buffer layer (not shown) is formed on the sapphire substrate 1.

Also, $H_2$ or a mixed gas of $N_2/H_2$ may be used as the carrier gas used when forming the GaN film.

Further, each of the embodiments above described a case where a free-standing GaN wafer (GaN film 3) is manufactured. It should be appreciated, however, that the manufacturing method of a compound semiconductor wafer of the present invention is not limited to the manufacturing of a GaN wafer, and is also applicable in manufacturing any other kind of compound semiconductor wafer including nitrogen, and the same advantages can be obtained in each case. In short, the present invention can be applied to a compound semiconductor wafer including at least one element from Ga, Al, B, As, In, P and Sb and N in its composition. A typical example is a compound semiconductor wafer expressed by a general formula $B_xAl_yGa_zIn_{1-x-y-z}N$, where $0<x\leq1$, $0\leq y\leq1$, $0\leq z\leq1$, and $0\leq x+y+z\leq1$, and to be more concrete, the example includes an AlN wafer, an AlGaN wafer, an InGaN wafer, an AlGaInN wafer, a BN wafer, a BAlN wafer, a BGaN wafer, etc.

Also, the sapphire substrate or the GaAs substrate is used as a substrate that will be used as an underlying substrate when forming a compound semiconductor wafer in each of the embodiments above. However, even when a substrate other than the sapphire substrate or GaAs substrate is used, the advantages same as those attained in each of the embodiments above can be obtained as long as a compound semiconductor film including nitrogen can be grown thereon through epitaxial growth. Examples of a substrate other than the sapphire substrate and the GaAs substrate include a spinel substrate, an Si substrate, an SiC substrate, etc. Further, a thin film of a compound semiconductor including nitrogen, such as a GaN film, an AlGaN film, and an AlN film, may be pre-formed on the surface of any of these substrates.

In addition, laser light having energy larger than a band-gap of GaN needs to be used, and besides the third harmonics from the Nd/YAG laser, laser light (wavelength: 248 nm) from an excimer KrF laser or the like is preferably used. In addition, in case that a spinel substrate is used instead of the sapphire substrate 1, the laser light can pass through the substrate, thereby making it possible to separate the substrate by exploiting properties that the laser light is absorbed in the GaN film 3 alone.

While the foregoing embodiments and the modified examples thereof use an $SiO_2$ film as the protector film 2, the protector film of the present invention is not limited thereto. Aside from the $SiO_2$ film, the present invention may use protector films of other materials including a variety of oxide films, such as an $Al_2O_3$ film, a $ZrO_2$ film, and an MgO film, as long as they have the function of interfering with the epitaxial growth of a nitrogen-containing compound semiconductor film. In particular, transparent protector films having transparency to laser light are preferable.

What is claimed is:

1. A manufacturing method of a compound semiconductor wafer, comprising:
    a step (a) of forming a closed-ring protector film covering a part of a top surface and a side surface of a substrate;
    a step (b) of conducting, after said step (a), epitaxial lateral growth of a compound semiconductor film including nitrogen in a composition thereof on the top surface of said substrate at a region where it is not covered with said protector film; and
    a step (c) of removing said substrate after said step (b), wherein said protector film formed in said step (a) has a function of interfering with the epitaxial lateral growth of said compound semiconductor film formed in said step (b).

2. The manufacturing method of a compound semiconductor wafer according to claim 1, wherein, in said step (a), said protector film is formed so as to cover at least the side surface of said substrate entirely.

3. The manufacturing method of a compound semiconductor wafer according to claim 1, wherein, in said step (a), said protector film is formed so as to cover only an edge part of the top surface of said substrate.

4. The manufacturing method of a compound semiconductor wafer according to claim 3, wherein, in said step (a), said protector film is formed so that a ring width of said protector film is larger than a film thickness of said compound semiconductor film.

5. The manufacturing method of a compound semiconductor wafer according to claim 1, wherein said protector film is made of at least one film selected from the group consisting of a silicon dioxide film, a silicon nitride film, a silicon oxynitride film, and a refractory metal film.

6. The manufacturing method of a compound semiconductor wafer according to claim 1, wherein, in said step (c), said substrate is removed by means of polishing.

7. The manufacturing method of a compound semiconductor wafer according to claim 1, wherein:
   in said step (b), said compound semiconductor film is made of a compound semiconductor having an absorption edge wavelength longer than an absorption edge wavelength of said substrate; and
   in said step (c), said compound semiconductor film is decomposed by irradiating light having an intermediate wavelength between the absorption edge wavelength of said substrate and the absorption edge wavelength of said compound semiconductor film from said substrate side, so that said substrate and said compound semiconductor film are separated from each other.

8. The manufacturing method of a compound semiconductor wafer according to claim 1, wherein, in said step (c), said substrate is removed by means of etching.

9. The manufacturing method of a compound semiconductor wafer according to claim 1, wherein a back surface of said compound semiconductor film is polished after said step (c).

10. The manufacturing method of a compound semiconductor wafer according to claim 1, wherein, in said step (b), a compound semiconductor film including N and at least one element selected from the group consisting of Ga, Al, B, As, In, P and Sb in a composition thereof is formed as said compound semiconductor film.

11. A manufacturing method of a compound semiconductor wafer, comprising:
   a step (a) of conducting epitaxial growth of a compound semiconductor film including nitrogen in a composition thereof on a substrate;
   a step (b) of removing at least a portion of said compound semiconductor film located on an upper side surface of said substrate; and
   a step (c) of removing said substrate after said step (b).

12. The manufacturing method of a compound semiconductor wafer according to claim 11, wherein, in said step (b), at least the portion of said semiconductor film located on the side surface of said substrate is removed by means of polishing.

13. The manufacturing method of a compound semiconductor wafer according to claim 11, wherein, in said step (b), said substrate and said compound semiconductor film located inside the side surface is cut in a closed-ring shape.

14. The manufacturing method of a compound semiconductor wafer according to claim 11, wherein, in said step (b), an inside portion of said compound semiconductor film from the side surface is removed.

15. The manufacturing method of a compound semiconductor wafer according to claim 11, wherein, in said step (c), said substrate is removed by means of polishing.

16. The manufacturing method of a compound semiconductor wafer according to claim 11, wherein:
   in said step (b), said compound semiconductor film is made of a compound semiconductor having an absorption edge wavelength longer than an absorption edge wavelength of said substrate; and
   in said step (c), said compound semiconductor film is decomposed by irradiating light having an intermediate wavelength between the absorption edge wavelength of said substrate and the absorption edge wavelength of said compound semiconductor film from said substrate side, so that said substrate and said compound semiconductor film are separated from each other.

17. The manufacturing method of a compound semiconductor wafer according to claim 11, wherein, in said step (c), said substrate is removed by means of etching.

18. The manufacturing method of a compound semiconductor wafer according to claim 11, wherein a back surface of said compound semiconductor film is polished after said step (c).

19. The manufacturing method of a compound semiconductor wafer according to claim 11, wherein, in said step (a), a compound semiconductor film including N and at least one element selected from the group consisting of Ga, Al, B, As, In, P and Sb in a composition thereof is formed as said compound semiconductor film.

20. A manufacturing method of a compound semiconductor wafer, comprising:
   a step (a) of depositing a film covering a top surface and a side surface of a substrate;
   a step (b) of removing said film until at least the top surface of said substrate is exposed, thereby flattening said substrate and said film at the top to form a closed-ring protector film covering at least the side surface of said substrate;
   a step (c) of conducting, after said step (b), epitaxial growth of a compound semiconductor film including nitrogen in a composition thereof on the top surface of said substrate at a region where it is not covered with said protector film; and
   a step (d) of removing said substrate after said step (c),
   wherein said protector film formed in the step (b) has a function of interfering with the epitaxial growth of the compound conductor film formed in said step (c).

21. The manufacturing method of a compound semiconductor wafer according to claim 20, wherein:
   said step (a) is preceded by an additional step of removing a peripheral portion of said substrate to form a notch; and
   in said step (b), said protector film is formed so as to cover the side surface and the notch of said substrate.

* * * * *